United States Patent
DeOrnellas et al.

(10) Patent No.: US 6,951,820 B2
(45) Date of Patent: Oct. 4, 2005

(54) METHOD FOR USING A HARD MASK FOR CRITICAL DIMENSION GROWTH CONTAINMENT

(75) Inventors: Stephen P. DeOrnellas, Santa Rosa, CA (US); Leslie G. Jerde, Novato, CA (US); Alferd Cofer, Petaluma, CA (US)

(73) Assignee: Silicon Valley Bank, Santa Clara, CA (US)

( * ) Notice: Subject to any disclaimer, the term of this patent is extended or adjusted under 35 U.S.C. 154(b) by 0 days.

(21) Appl. No.: 10/045,318

(22) Filed: Nov. 9, 2001

(65) Prior Publication Data

US 2002/0132485 A1 Sep. 19, 2002

Related U.S. Application Data

(63) Continuation of application No. 09/692,007, filed on Oct. 19, 2000, which is a continuation of application No. 09/009,369, filed on Jan. 20, 1998, now Pat. No. 6,287,975.

(51) Int. Cl.⁷ ................. H01L 21/302; H01L 21/3065
(52) U.S. Cl. ............... 438/706; 438/710; 438/742; 252/79.1
(58) Field of Search ................. 438/706, 710, 438/742; 252/79.1

(56) References Cited

U.S. PATENT DOCUMENTS

| | | | | |
|---|---|---|---|---|
| 3,615,953 A | * | 10/1971 | Hill | 156/17 |
| 4,350,563 A | * | 9/1982 | Takada et al. | 156/643 |
| 4,390,394 A | | 6/1983 | Mathuni et al. | 156/643 |
| 4,496,419 A | * | 1/1985 | Nulman et al. | 156/643 |
| 4,741,799 A | * | 5/1988 | Chen et al. | 156/643 |
| 4,948,462 A | * | 8/1990 | Rossen | 438/16 |
| 5,126,288 A | * | 6/1992 | Nakagawa | 438/712 |
| 5,170,231 A | * | 12/1992 | Fujii et al. | 257/77 |
| 5,320,979 A | * | 6/1994 | Hashimoto et al. | 438/640 |
| 5,515,984 A | | 5/1996 | Yokoyama et al. | 216/41 |
| 6,004,882 A | * | 12/1999 | Kim et al. | 438/706 |

* cited by examiner

*Primary Examiner*—Nadine G. Norton
*Assistant Examiner*—Lynette T. Umez-Eronini
(74) *Attorney, Agent, or Firm*—Fliesler Meyer, LLP

(57) ABSTRACT

A method for containing the critical dimension growth of the feature on a semiconductor substrate includes placing a substrate with a hard mask comprised of a reactive metal or an oxidized reactive metal in a chamber and etching the wafer. The method further includes using a hard mask which has a low sputter yield and a low reactivity to the etch chemistry of the process.

10 Claims, 2 Drawing Sheets

METHOD FOR USING A HARD MASK FOR CRITICAL DIMENSION GROWTH CONTAINMENT

This application is a continuation of Ser. No. 09/692,007 filed Oct. 19, 2000, which is a continuation of Ser. No. 09/009,369, filed Jan. 20, 1998, now U.S. Pat. No. 6,287,975.

FIELD OF THE INVENTION

The present invention is directed to a method for minimizing and containing the critical dimension growth of a feature on a semiconductor wafer and any other product, such as for example, the magnetic head for a disk drive and a flat panel display, which could be constructed using semiconductor processing techniques.

BACKGROUND OF THE INVENTION

The critical dimension (CD) of a feature on a semiconductor wafer, or any product fabricated using semiconductor processing techniques, is a width of that feature. The pitch is generally defined as a critical dimension plus the distance to the next feature.

For semiconductor process methods using etch techniques, lithographic masking layers, such as for example photoresist layers, can be formed on top of the material to be etched. Photoresist layers define the desired features, masking the portion of underlying layer which is not to be etched, and leaving exposed the portion to be etched. During the etching process, materials from a portion of the layer which is etched, as well as compounds formed by various combinations of the etchant gases, the lithographic mask, and the materials of the layer to be etched, can tend to coat the sides of the desired feature, and the lithographic mask, and thereby increase the critical dimension of the feature beyond that defined immediately under the lithographic mask. Such growth of the critical dimension can disadvantageously diminish the space between the features and thereby adversely affect the functionality of the features.

As is known in the art, lithographic masks can include by way of example only, (i) soft masks such as photoresist masks, e-beam resist masks, x-ray resist masks, and syncotron particle acceleration resist masks, and (ii) hard masks, such as metals and oxides of metals such as silicon dioxide ($SiO_2$). However, such soft and hard masks have not been found to be particularly useful in controlling the critical dimension growth.

Accordingly, there is a need to provide a semiconductor processing methodology which allows for the desired features to be appropriately etched without causing a growth of the critical dimension of the feature during the etching process.

SUMMARY OF THE INVENTION

The present invention provides for a methodology which allows for etching the features while controlling or minimizing the growth of the critical dimension of the feature during the etching process. The method is useful for fabricating semiconductor wafers in order to produce chip products, magnetic heads for disk drives, and flat panel displays, by way of example only.

The method for critical dimension growth containment includes placing a wafer with a hard mask comprised of a reactive metal, deposited over a layer to be etched in a reactor and etching the wafer in the reactor. The placing step further includes placing a hard mask which is comprised of a reactive metal of an oxide, nitride, fluoride, carbide, boride, or some combination of an oxide, nitride, fluoride, carbide, and/or boride of a reactive metal. Such combination could include, by way of example only, an oxinitride, oxiboride, oxifluoride or oxicarbide, of a reactive metal or any other combination or compound formed by exposing a reactive metal to ions or radicals of any combinations of oxygen, nitrogen, fluorine, boride, and/or carbon.

The placing step further includes placing a wafer having a hard mask which is comprised of one of titanium, aluminum, tantalum, tungsten, cobalt, or molybdenum, or an oxide, nitride fluoride carbide or boride of said reactive metals.

The hard mask could include other reactive metals such as copper, iron and nickel and their compounds.

The method also includes exposing a hard mask to a stream of oxidizing gas such as oxygen, nitrogen, fluorine, boron or carbon in the reactor prior to or during the etch step in order to form a compound with the reactive metal.

The method also includes exposing a hard mask to an ion or radical of oxygen, nitrogen, fluorine, boron or carbon in the reactor prior to or during the etch step in order to form an oxide, a nitride, a fluoride, a boride or a carbide or some combination of the preceding on the reactive metal.

The hard mask can also include any materials that are compatible with semiconductor fabrication processes, and semiconductor manufacturing tools and equipment which have the characteristics described herein.

The invention further includes selecting a hard mask which has or can develop an oxide, nitride, fluoride, carbide, or boride, or some combination of a reactive metal.

In another aspect of the invention, the method includes increasing the rate that one of an oxide, a nitride, a fluoride, a boride or a carbide forms on the hard mask in order to slow down the rate of erosion of the hard mask.

The invention further includes selecting a hard mask that is comprised of a metal which has a low sputter yield.

A further aspect of the present invention is to provide a method for containing critical dimension growth during an etching process including the step for placing a wafer or other substrate, for making by way of example only, a semiconductor product, a magnetic head or a flat panel display, with a hard mask disposed over a layer to be etched in a reactor, wherein the hard mask has at least one of a low sputter yield and a low reactivity to the etch chemistry of the etch process.

Accordingly, it is an object of the present invention to contain, control and minimize the growth of the critical dimension of a feature being etched.

It is still a further object of the present invention to perform the methodology of controlling and minimizing the critical dimension growth of a feature during an etch process, whether the process be conducted at low (below atmospheric) pressure, atmospheric pressure, or high (above atmospheric) pressure.

Other objects, advantages and features of the invention will be described herein and evidenced in the claims and figures.

DETAILED DESCRIPTION OF THE PREFERRED EMBODIMENT

Figure 4:
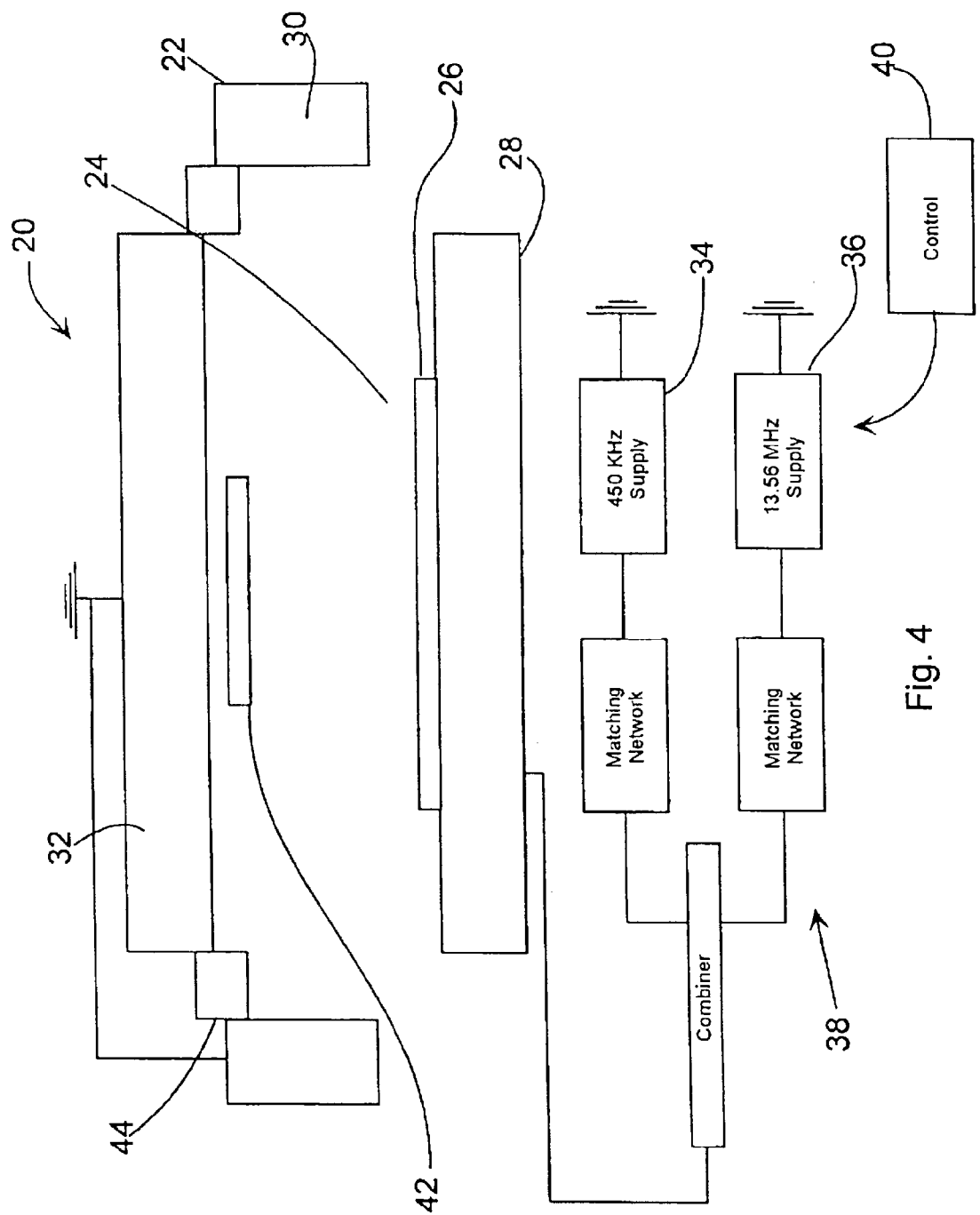
FIG. 4 depicts a schematical representation of an etch reactor wherein the method of the present invention can be carried out.

The method of the present invention can be performed in an etch reactor such as the etch reactor depicted in FIG. 4. It is to be understood that other reactors including but not limited to other etch reactors can be used and be within the spirit and scope of the invention.

The etch reactor of FIG. 4 is identified by the number 20 and is configured as a multi-frequency, tri-electrode reactor. The etching apparatus 20 includes a housing 22 and an etching chamber 24. A wafer 26 is positioned on a chuck incorporated into a bottom electrode 28. The chamber 24 further includes a side peripheral electrode 30 and an upper electrode 32. In a preferred embodiment, the side peripheral electrode 30 can be grounded or allowed to establish a floating potential as a result of the plasma developed in the chamber 24. The upper electrode 32 is generally grounded, but could also be designed to have a floating electrical potential. In typical operation, both the side peripheral electrode 30 and the upper electrode 32 are grounded as shown in FIG. 4.

Preferably two AC power supplies, first power supply 34 and a second power supply 36, are connected to the bottom electrode 28 through an appropriate circuitry 38, which can include by way of example only, matching networks and a combiner. Further a controller 40 controls the sequencing of the first and second AC power supplies 34, 36. Typically for this particular example only, the first power supply 34 operates in the kilohertz range and is optimally provided at about 450 KHz, and typically in the range of less than 500 KHz. The second power supply 36 operates in the megahertz range, and typically operates at about 13.56 MHz, although other frequencies about above 1 MHz and also multiples of 13.56 MHz can be used with the present invention. The power supply 34 is powered at 200 watts and the second power supply 36 is powered at 500 watts for this example. Ion energy increases towards the kilohertz range while the ion density increases towards the megahertz range.

Additionally, reactor 20 includes gas inlet head 42 and a gas outlet port 44. Further, and preferably, the chuck 28 is heated so that a wafer positioned thereon is itself heated in the range of about 80° C. to about 300° C. during the process.

The growth in the critical dimension is attributable to the deposit of etched materials, mask materials, and/or compounds of etched materials, mask materials, and/or process gases on the sidewalls of the feature being etched and on the soft and/or hard masks. By way of example only, in a reactor for etching platinum with chlorine gas, materials which can stick to the sidewalls generally include platinum dichloride ($PtCl_2$), a platinum trichloride ($PtCl_3$), and/or other compounds. It is to be understood that the present process can be used more favorably for etching films comprised of platinum (Pt), copper (Cu), iridium (Ir), iridium dioxide ($IrO_2$), lead zirconium titanate (PZT), ruthenium (Ru), ruthenium dioxide ($RuO_2$), barium strontium titanate (BST), and bismuth strontium tantalate (Y-1 or SBT). These materials being etched are either metals or compounds which are of low volatility. Still other films and other semiconductor and non-semiconductor processes can benefit from this method.

Figure 1:
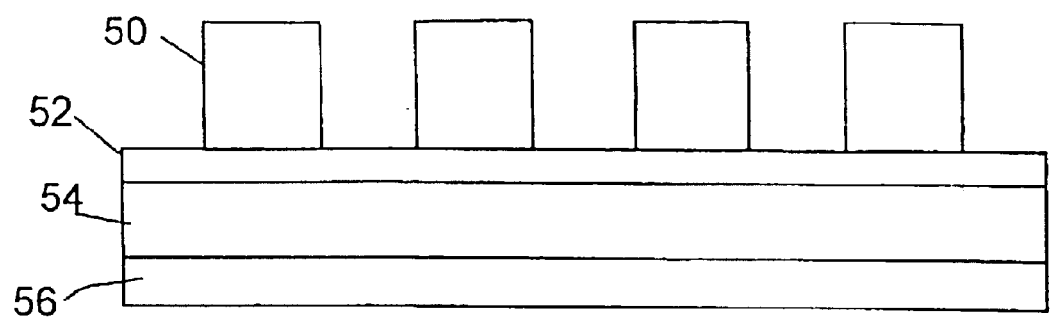
FIG. 1 depicts a schematical representation of a side elevational view of a wafer with a starting photoresist pattern placed over a hard mask, with the hard mask placed over the material to be etched.
Figure 2:
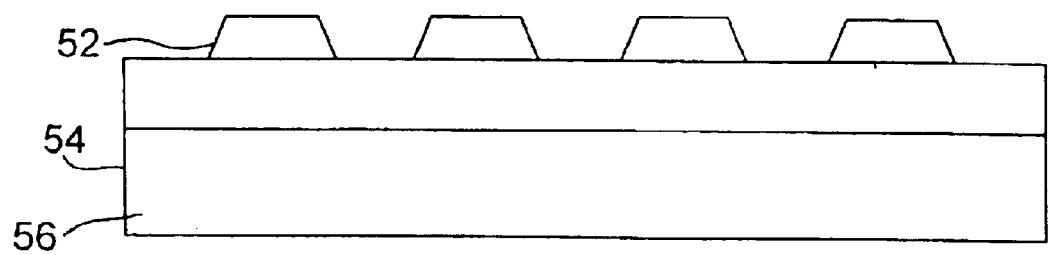
FIG. 2 depicts a schematical representation similar to FIG. 1 which has been etched in order to define the hard mask layer.
Figure 3:
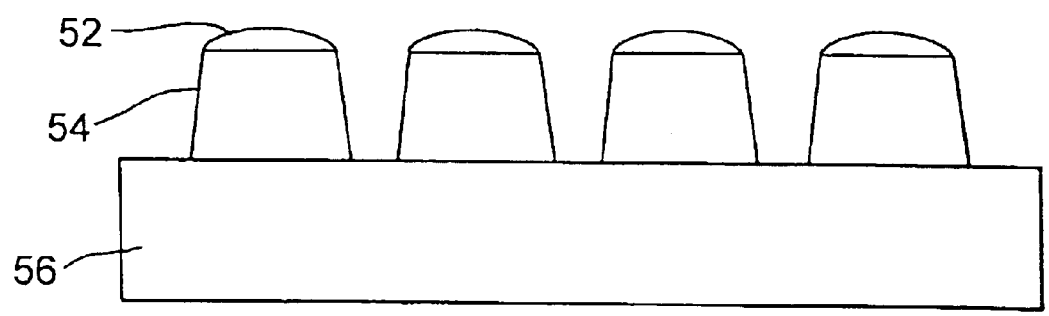
FIG. 3 depicts a feature similar to FIG. 2 which has been etched to define the pattern in the material lying under the hard mask.

FIGS. 1–3 depict various stages of the inventive etch method using the reactor of FIG. 4. FIG. 1 represents a schematical representation of a scanning electron micrograph (SEM). In FIG. 1, the discrete upright structures represent the lithographic mask (a soft mask and in particular a photoresist mask in this example) 50 which is patterned upon a hard mask 52 which has not yet been etched. The hard mask 52 has been deposited on layer 54, which is the material to be ultimately etched. Layer or film 54 is deposited on substrate 56.

In the embodiment of FIG. 1, the lithographic mask (soft mask) 50 is positioned on a hard mask 52, which hard mask is comprised of titanium nitride (TiN). The hard mask 52 is deposited on the layer 54 to be etched which in this embodiment is platinum (Pt). Layer 54 is deposited over a substrate 56 which can include, for example, silicon. The first step in the process is to etch the hard mask 52 into the desired pattern represented by the photoresist mask 50. The result of this process can be seen in FIG. 2. FIG. 3 depicts a representation where the platinum layer has been overetched. Table 1 below records the changes in dimension in profile, pitch, feature, and space for the above four figures, where the pitch is equal to the feature dimension plus the space dimension. The change value is measured relative to the feature dimension of FIG. 1.

TABLE 1

Pt Etch Process with Over-Etch
0.025 μ CD gain with 79° profile (CD)

| | Profile | Pitch | Feature | Space | Change |
|---|---|---|---|---|---|
| Starting resist mask layer CD (FIG. 1) | 79.2° | 0.564 μ | 0.307 μ | 0.257 μ | — |
| Starting TiN mask layer CD (FIG. 2) | 66.7° | 0.557 μ | 0.317 μ | 0.240 μ | +0.010 μ |
| Pt layer CD (FIG. 3) | 78.9° | 0.555 μ | 0.332 μ | 0.227 μ | +0.025 μ |

The operating parameters for Table 1 using the reactor of FIG. 4 are as follows:

| Pressure: | 1 to 50 millitorr |
|---|---|
| MHz Power: | 110 to 1500 watts |
| KHz Power: | 0 to 500 watts |
| Total Flow Rate: | 10 to 500 SCCM |
| HBR Flow Rate: | 0 to 200 SCCM |
| $CL_2$ Flow Rate: | 0 to 200 SCCM |
| $O_2$ Flow Rate: | 0 to 200 SCCM |

A similar platinum process yielded no CD gain and an 84° profile. The starting material for the hard mask was titanium. Dimensional features for this etching process are shown below in Table 2. The etching was allowed to proceed to over-etch. The operating parameters for this particular process are in accordance with those of Table 1. Table 2 demonstrates that the invention allows the critical dimension to be held steady, without any substantial growth during the etch process.

TABLE 2

Pt Etch Process with Over-Etch
0.00 μ CD gain with 84° profile

|  | Profile | Pitch | Feature | Space | Change |
|---|---|---|---|---|---|
| Starting resist mask layer CD | 79.2° | 0.564 μ | 0.307 μ | 0.257 μ | — |
| Starting Ti mask layer CD | 66.7° | 0.557 μ | 0.317 μ | 0.240 μ | +0.010 μ |
| Pt layer CD | 84° | 0.555 μ | 0.310 μ | 0.254 μ | +0.003 μ |

Generalizing from the above, the invention includes a method for containing critical dimension growth of a feature located on a wafer during an etch process wherein the wafer includes a hard mask comprised of a reactive metal or the oxide, nitride, fluoride, boride, or carbide, and/or combination thereof, of a reactive metal deposited over a layer to be etched. The oxide, nitride, fluoride, boride or carbide or combination thereof can be either (i) deposited as a layer, or (ii) formed in situ by exposing the reactive metal to a stream of oxygen, nitrogen, fluorine, boron or carbon and/or ions or radicals of the same either prior to or during the etch process. The hard mask layer thus acts as a self-passivation layer. In general, the class of reactive metals which are most appropriate of the present invention include titanium (Ti), aluminum (Al), and tantalum (Ta). Other reactive metals could include copper (Cu), tungsten (W), iron (Fe), nickel (Ni), cobalt (Co), and molybdenum (Mo). The most appropriate oxides and nitrides are titanium oxide ($TiO_2$), aluminum oxide ($Al_2O_3$), titanium nitride (TiN), tantalum pentoxide ($Ta_2O_5$), and tantalum nitride (TaN). Metal analogs of fluorides, borides, and carbides are also appropriate.

Other metals which are reactive and readily form oxides, nitrides, fluorides, borides or carbides come within the spirit and scope of the invention. Further, these metals preferably have a low sputtering yield with etchants which further enhances critical dimension growth containment. Table 3 below compares the sputtering yield of these materials against platinum and silicon dioxide for argon ion bombardment at 600 electron volts (eV).

TABLE 3

|  | Bombarding argon ion energy in 600 eV |
|---|---|
| Pt | 1.56 |
| $SiO_2$ | 1.34 |
| Ti | 0.58 |
| $TiO_2$ | 0.96 |
| Al | 1.24 |
| $Al_2O_3$ | 0.18 |
| Ta | 0.62 |
| $Ta_2O_5$ | 0.15 |
| TiN | 1.60 |
| W | 0.62 |

Adding oxidants such as oxygen to the process gas and in particular with respect to a hard mask comprised of titanium or aluminum causes the formation of an oxide on the hard mask resulting in less erosion of the hard mask and a minimization of the critical dimension growth. This oxidation of the metal results in less sputtering, which means that the hard mask itself can be thinner. Similar advantages occur with the formation of nitrides, carbides, and/or borides, and/or some combinations thereof of reactive metals.

Accordingly, it can be seen that reactive metals which form skins of oxides, nitrides, fluorides, borides and/or carbides are advantageous to the method of the invention.

Further, increasing the temperature at the surface of the wafer, in preferably the range of 80° Centigrade to 300° Centigrade, increases the rate of oxidation which slows the erosion rate of the hard mask. Again, similar results are observed with oxides, nitrides, fluorides, carbides, and/or borides, and/or combinations thereof, of reactive metals.

Thus, from the above, it can be seen that the hard mask selected from a reactive metal or selected from an appropriate oxide, nitride, fluoride, carbide, boride, or some combination thereof, of a reactive metal, and which material has a favorably low sputter yield, is an appropriate material for the hard mask of the present invention. Such method is particularly important for controlling critical dimension growth for a submicron feature and in particular for features which have a pitch of less than 0.5μ.

Further, it is to be understood that for the above preferred hard mask, a low sputter yield, and a low chemical reactivity of the mask with the process gases is a consideration. For example, from Table 3, a quick review would tend to suggest that titanium with a sputter yield of 0.58 would be a more appropriate hard mask than titanium oxide with a sputter yield of 0.96. However, with etchant gas of chlorine, the titanium is more reactive than the titanium oxide and thus, the titanium oxide could provide for better critical dimension growth containment even though it has a higher sputter yield.

INDUSTRIAL APPLICABILITY

From the above, it can be seen that the method of the invention is useful for performing an etch or other semiconductor process step while containing critical dimension growth in order to develop features for submicron dimension products.

Other features, aspects and objects of the invention can be obtained from a review of the figures and the claims.

It is to be understood that other embodiments of the invention can be developed and fall within the spirit and scope of the invention as claimed.

We claim:

1. A method for etching a pattern on a workpiece, comprising:

selecting a workpiece with a hard mask deposited over a layer to be etched, which hard mask is comprised of a reactive metal, the hard mask further defining a pattern exposing portions of the layer to be etched including at least one portion having a critical dimension, said hard mask being substantially unoxidized; and processing the workpiece in the reactor by exposing the workpiece to oxidizing gas prior to exposure to an etchant in order to expose the hard mask to the oxidizing gas and form an oxide skin on the exposed surface of the hard mask, and in order to subsequently etch the layer corresponding to the pattern of the hard mask, whereby growth of the layer during the etch is minimized in the portion of the layer corresponding to the critical dimension.

2. The method of claim 1 wherein:

said selecting step includes selecting a workpiece having a hard mask, which hard mask comprises of one of titanium, aluminum, and tantalum.

3. The method of claim 1, wherein:

the oxidizing gas comprises one of oxygen, nitrogen, fluorine, boron, and carbon gas, and any combination of oxygen, nitrogen, fluorine, boron, and carbon gas, in the reactor prior to or during said etch step.

4. The method of claim 1, wherein:
said selecting step includes selecting a workpiece with a lithographic layer covering the hard mask.

5. The method of claim 1, wherein:
said selecting step includes selecting a substrate having a hard mask which is readily oxidizable.

6. The method of claim 1 wherein:
said selecting step includes selecting a substrate with a hard mask, which hard mask is comprised of a metal with a low sputtering yield.

7. The method of claim 1, wherein:
oxidizing the hard mask oxidizes the surface of the hard mask, thereby slowing down an etch rate of the hard mask.

8. The method of claim 1 wherein:
said selecting step includes selecting a hard mask (1) on which has been or (2) on which can be developed at least one of an oxide, nitride, fluoride, boride and carbide.

9. A method for etching a pattern on a workpiece, comprising:

processing a workpiece using etch process gases, the workpiece having a hard mask material deposited over a layer to be etched, which the hard mask material is comprised of a reactive metal and defines a pattern wherein a portion of the layer is exposed, and wherein the hard mask material is exposed to a hardening gas for lowering at least one of its sputtering yield or erosion rate to form a hard mask prior to exposure to an etchant; and allowing the patterned hard mask to react with the etch process gas mixed together with a hardening gas to form a hard mask in order to further lower at least one of the sputtering yield and erosion rate of the hard mask and to etch the layer corresponding to the pattern of the hard mask.

10. The method of claim 9, wherein the hardening gas comprises a gas for lowering the erosion rate of the hard mask comprising one of oxygen, nitrogen, fluorine, boron, and carbon gas.

* * * * *